United States Patent
Hamilton et al.

(10) Patent No.: US 6,440,789 B1
(45) Date of Patent: *Aug. 27, 2002

(54) PHOTORESIST SPACER PROCESS SIMPLIFICATION TO ELIMINATE THE STANDARD POLYSILICON OR OXIDE SPACER PROCESS FOR FLASH MEMORY CIRCUITS

(75) Inventors: Darlene Hamilton; Len Toyoshiba, both of San Jose; Michael Fliesler, Santa Cruz, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/704,026

(22) Filed: Nov. 1, 2000

(51) Int. Cl.$^7$ ............................................. H01L 21/8238
(52) U.S. Cl. ...................... 438/232; 438/258; 438/275; 438/279; 438/307
(58) Field of Search ................................. 438/199, 200, 438/201, 223, 227, 228, 229, 230, 232, 266, 303, 275, 279, 258, 595, 307

(56) References Cited

U.S. PATENT DOCUMENTS

| | | | | |
|---|---|---|---|---|
| 5,395,781 A | * | 3/1995 | Wilhoit | 438/303 |
| 5,518,940 A | * | 5/1996 | Hodate et al. | 438/303 |
| 6,225,174 B1 | * | 5/2001 | Jeng et al. | 438/303 |
| 6,277,690 B1 | * | 8/2001 | Hamilton et al. | 438/258 |

* cited by examiner

Primary Examiner—Chandra Chaudhari
Assistant Examiner—Jack Chen
(74) Attorney, Agent, or Firm—H. Donald Nelson (57) ABSTRACT

A method of manufacturing a flash memory semiconductor device that eliminates the step of forming sidewall spacers on n-channel and p-channel transistor gate structures. Resist spacers having a dimension of $G_n+2S_n$ are formed on n-channel transistor gate structures and an N$^+$ implant is performed to form N$^+$ implant is performed to form N$^+$ regions in the n-channel substrate region. Resist spacers having a dimension of $G_s+2S_p$ are formed on p-channel transistor gate structures and a P$^+$ implant is performed to form P$^+$ regions in the p-channel substrate region.

3 Claims, 9 Drawing Sheets

PHOTORESIST SPACER PROCESS SIMPLIFICATION TO ELIMINATE THE STANDARD POLYSILICON OR OXIDE SPACER PROCESS FOR FLASH MEMORY CIRCUITS

BACKGROUND OF THE INVENTION

1. Field of the Invention

This invention relates generally to the manufacture of high density, high performance semiconductor devices. More specifically, this invention relates to the manufacturer of high density, high performance semiconductor devices utilizing a reduced number of steps during the manufacturing process.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimension and by increasing the number of devices per unit area on an integrated circuit chip. Another part of reducing the cost of a semiconductor chip is to increase the throughput of the fabrication facility. The requirement for cost reduction continues to force manufacturers to examine the reasons for each step of the semiconductor manufacturing process. This has been determined to be the key to driving cost lower and achieving higher yields. Many of the processes were developed during the early years of semiconductor manufacturing and have not been examined in detail.

A single semiconductor chip requires numerous process steps such as oxidation, etching, metallization and wet chemical cleaning. Some of these process steps involve placing the wafer on which the semiconductor chips are being manufactured into different tools during the manufacturing process. As can be appreciated, a reduction in the number of process steps in which the semiconductor wafers must be moved from one tool to another can be a major increase in the throughput of the fabrication facility as well as a major decrease in the cost of manufacturing the chips on the semiconductor wafer.

Therefore, what is needed are manufacturing processes that reduce the number of processing steps necessary to manufacture semiconductor wafers on which semiconductor integrated chips are manufactured.

SUMMARY OF THE INVENTION

According to the present invention, the foregoing and other objects and advantages are obtained by a method of manufacturing a semiconductor memory device that reduces the number of manufacturing steps required to manufacture the device.

In accordance with an aspect of the invention, the method includes the following sequence of steps: forming gate structures on a semiconductor substrate in regions in which core, n-channel and p-channel transistors are to be formed in a semiconductor substrate, forming PLdd implant regions in the p-channel transistor regions, forming NLdd implant regions in the n-channel transistor regions, forming resist spacers on n-channel gate structures, doing an $N^+$ implant to form $N^+$ regions, and forming resist spacers on p-channel gate structures, doing a $P^+$ implant to form $P^+$ regions. The combination of the above sequence of steps and the use of resist spacers allow the following steps to be skipped: spacer deposition step and spacer etch step.

The described method thus provides a method of manufacturing flash memory semiconductor devices that reduces the number of process steps required to manufacture flash memory devices.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment or specific embodiments of the present invention that illustrate the best mode or modes presently contemplated by the inventors for practicing the invention.

Figure 1A:
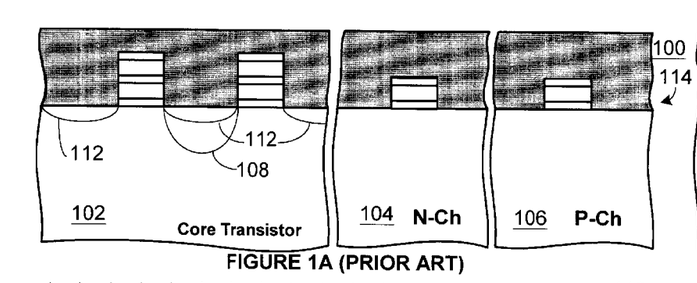
FIGS. 1A–1O show a number of the process steps necessary to manufacture a semiconductor wafer in accordance with the prior art.
Figure 1B:
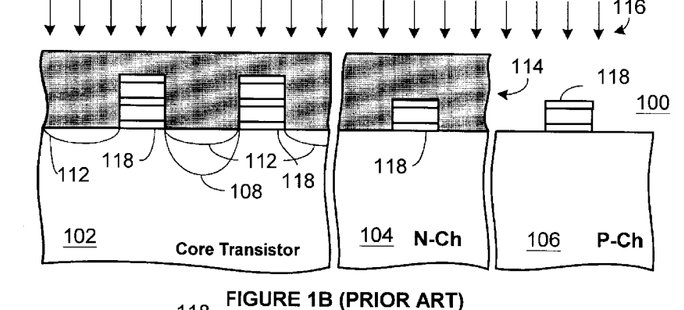
Figure 1C:
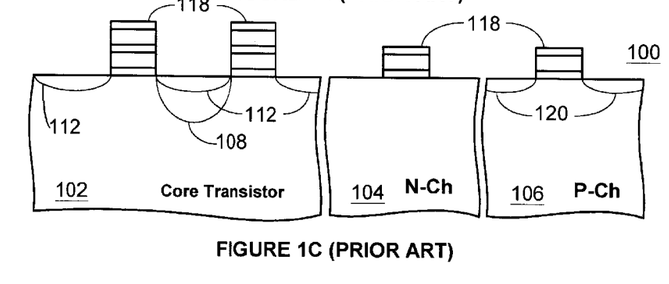
Figure 1D:
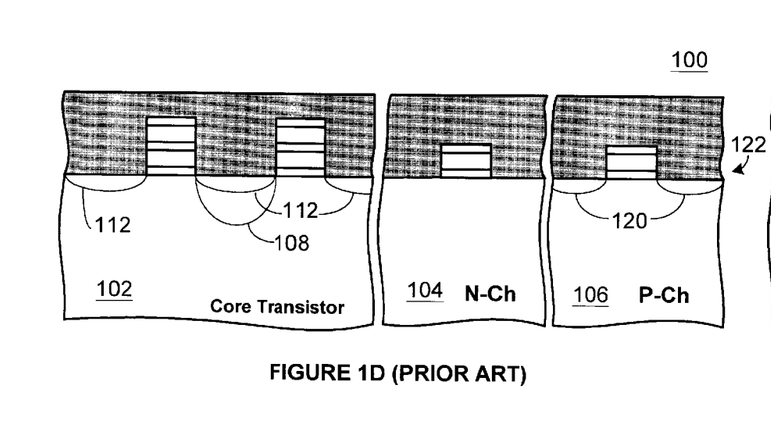
Figure 1E:
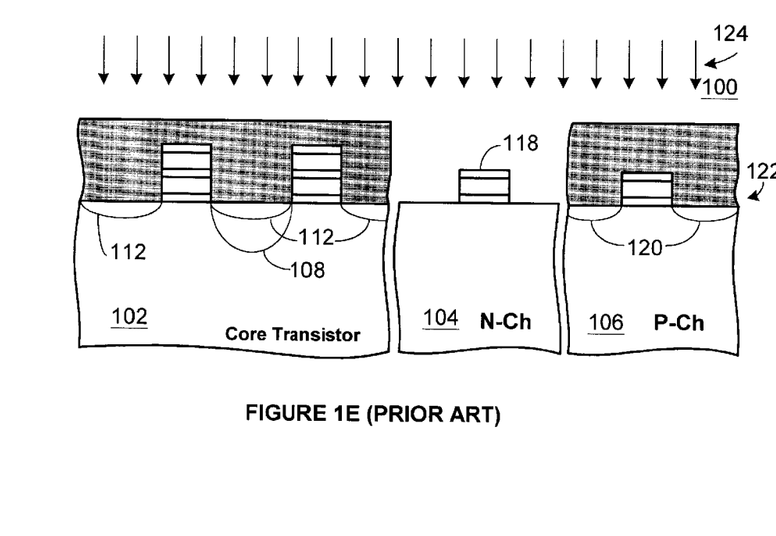
Figure 1F:
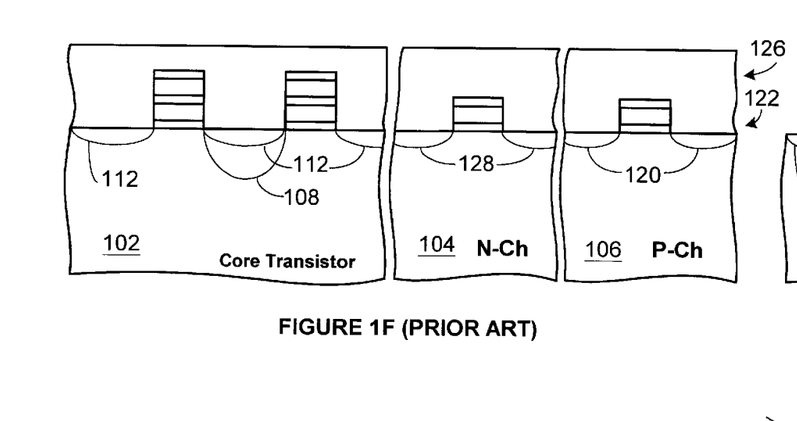
Figure 1G:
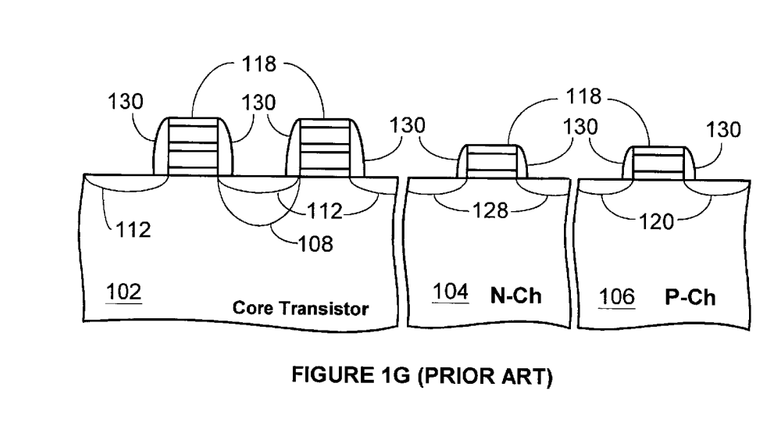
Figure 1H:
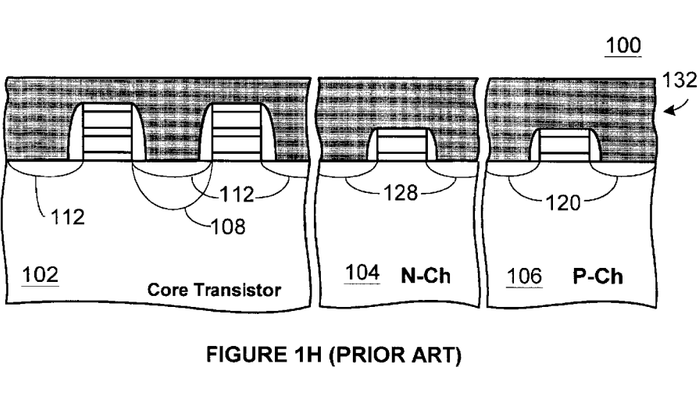
Figure 1I:
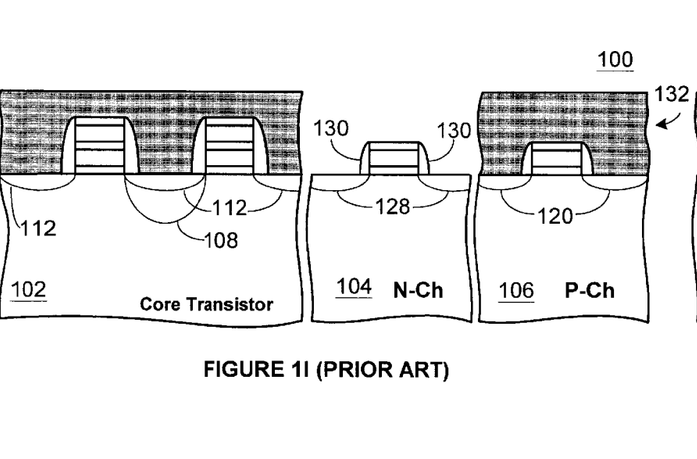
Figure 1J:
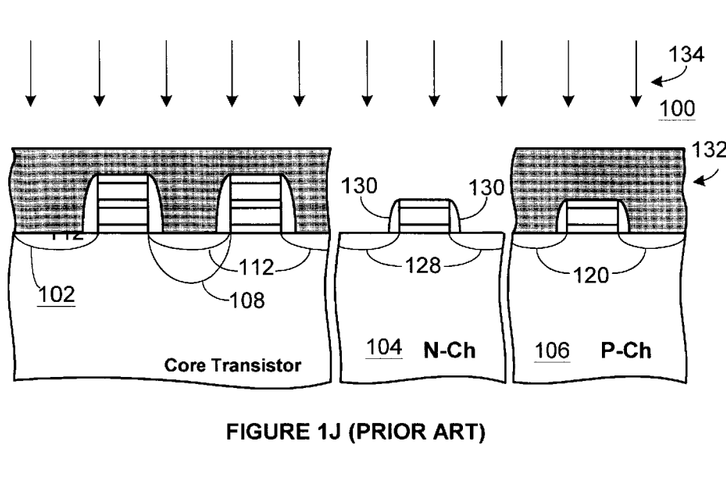
Figure 1K:
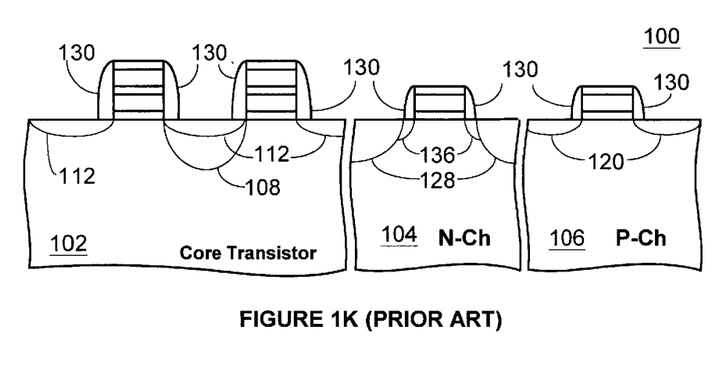
Figures 1L, 1M:
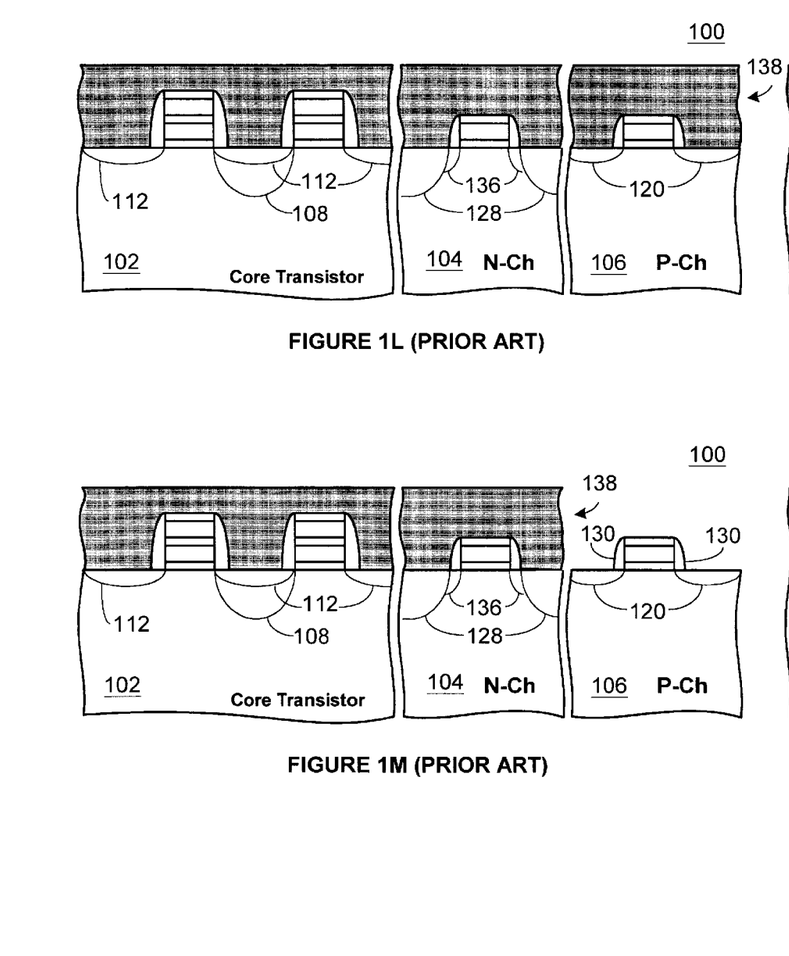
Figure 1N:
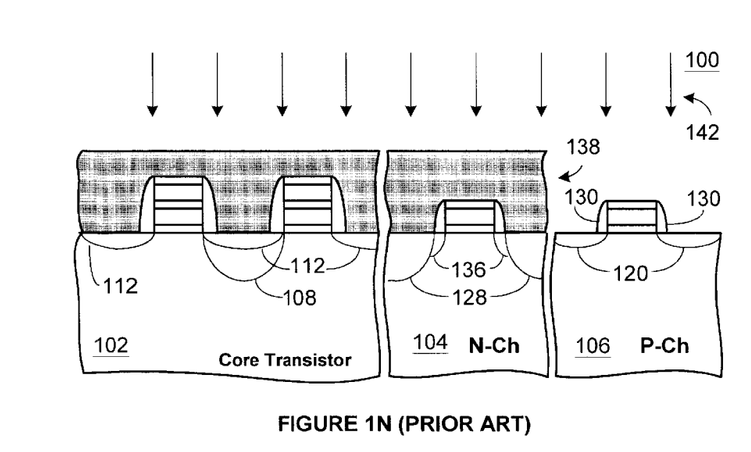
Figure 1O:
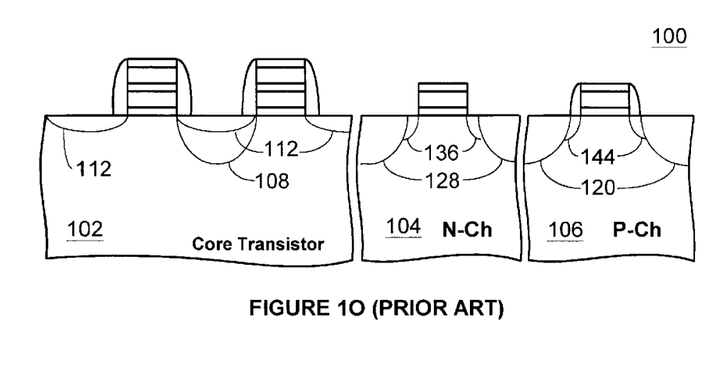
Figure 2A:
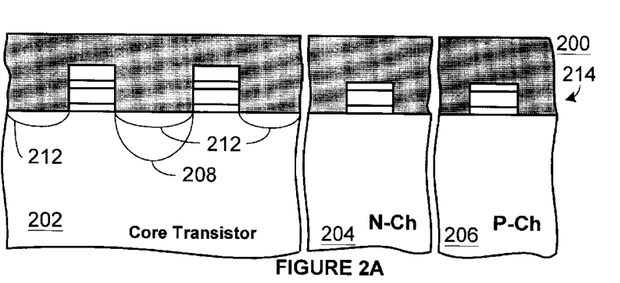
FIGS. 2A–2O show the reduced number of process steps in accordance with the present invention that are necessary to manufacture the semiconductor wafer processed in the prior art process shown in FIGS. 1A–1AD.
Figure 2B:
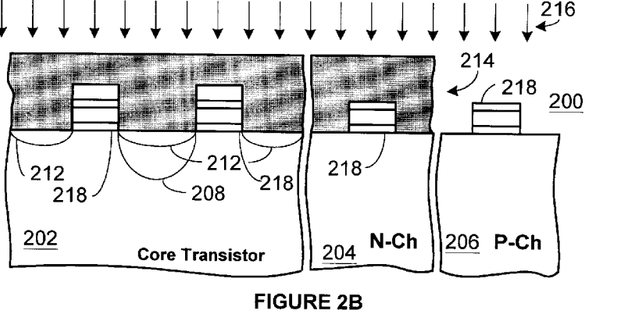
Figure 2C:
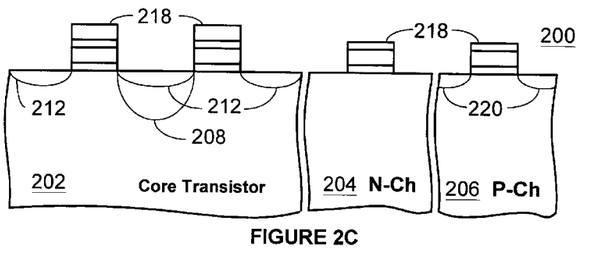
Figure 2D:
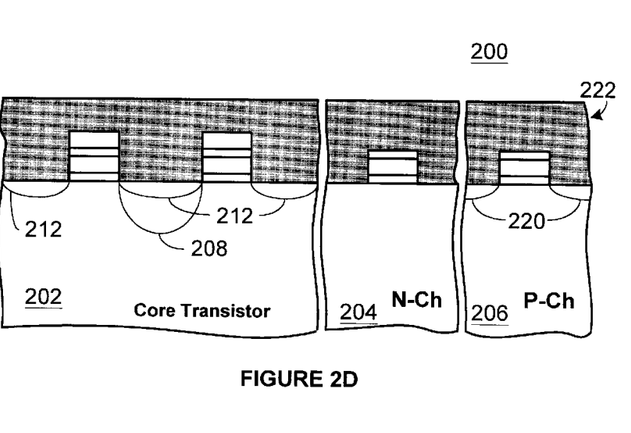
Figure 2E:
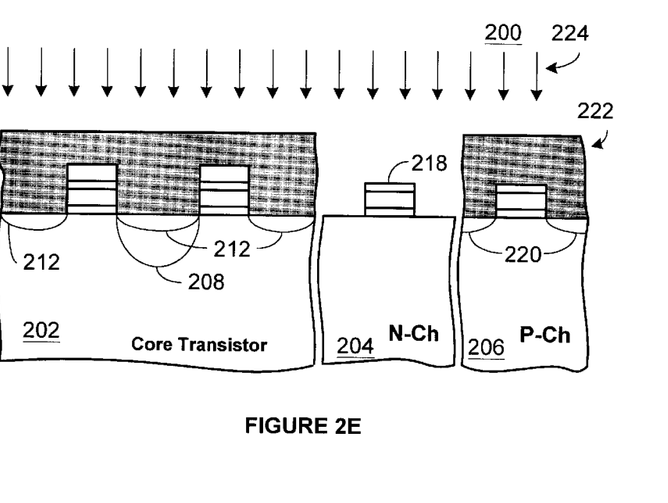
Figures 2F, 2G:
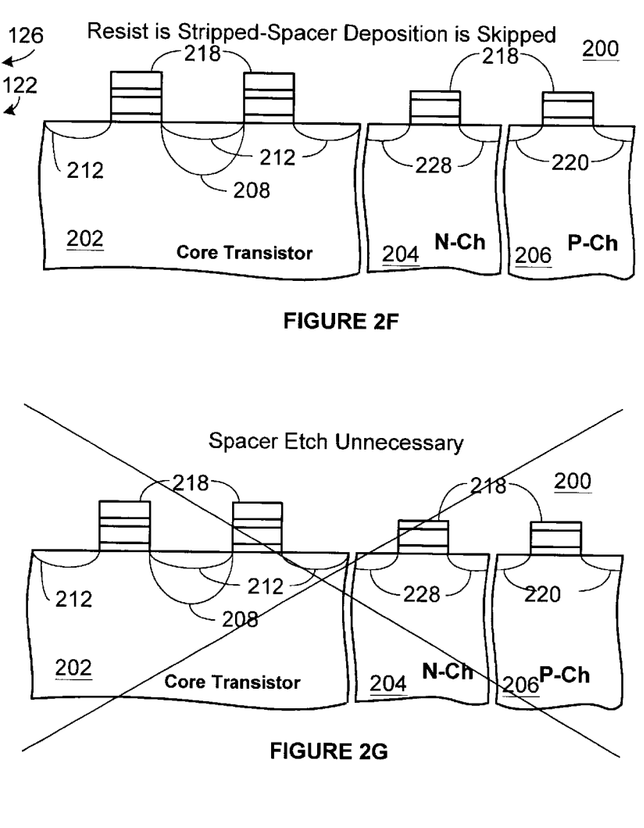
Figure 2H:
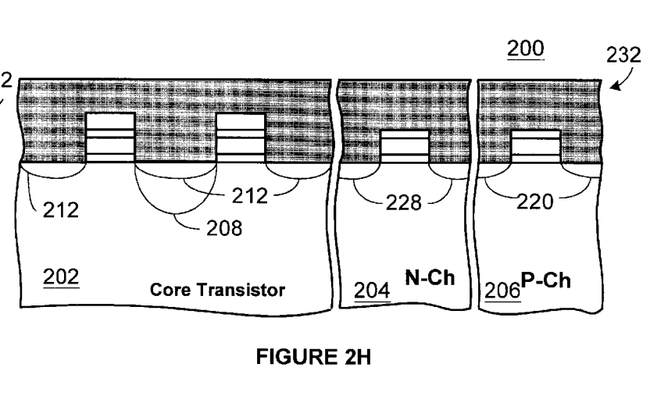
Figure 2I:
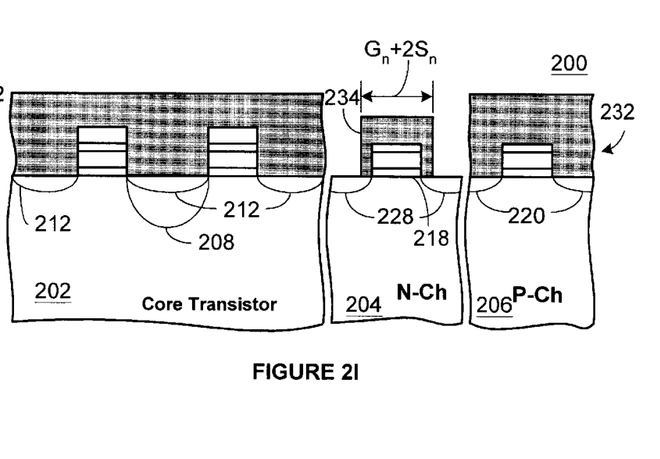
Figure 2J:
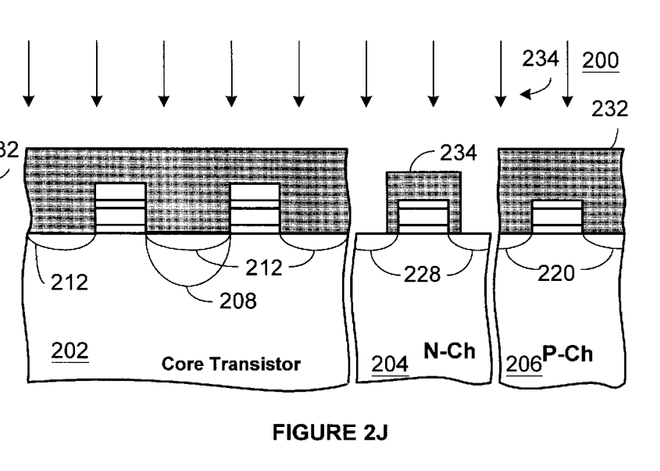
Figure 2K:
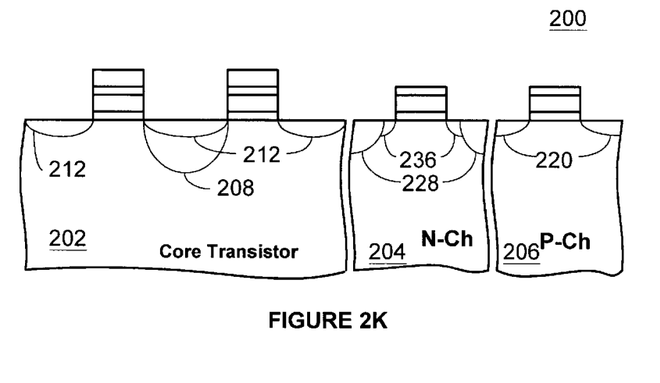
Figure 2L:
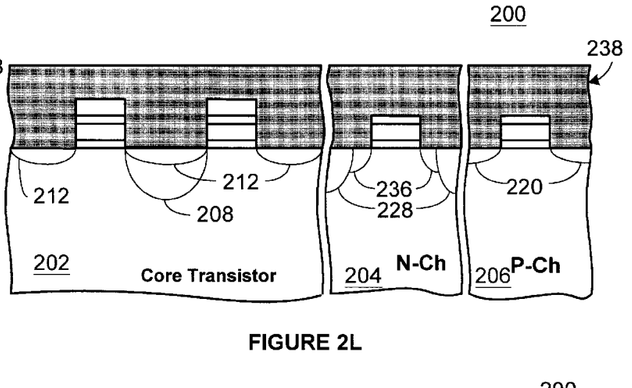
Figure 2M:
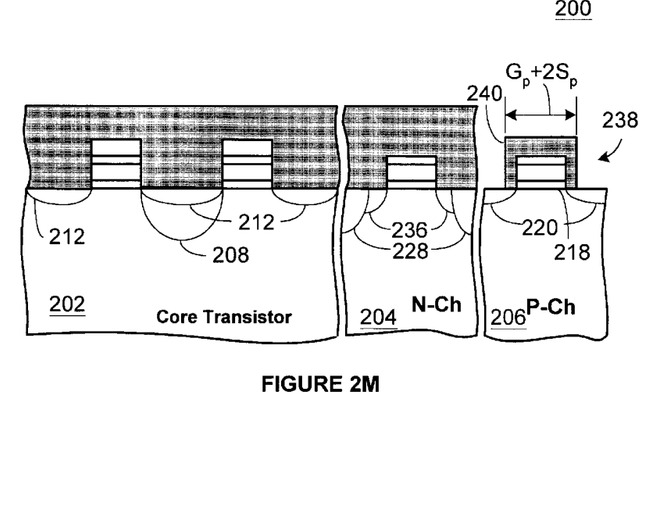
Figure 2N:
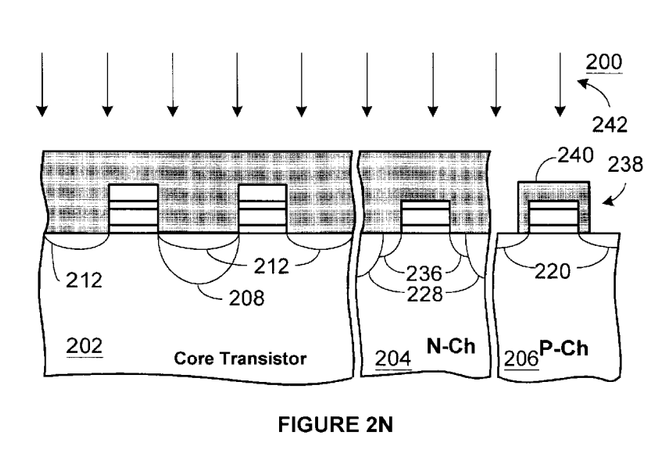
Figure 2O:
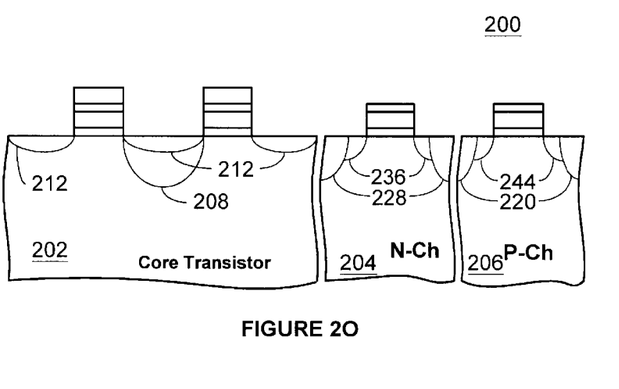

FIGS. 1A–1O show a number of the process steps necessary to manufacture a semiconductor wafer in accordance with the prior art, and FIGS. 2A–2O show the reduced number of process steps in accordance with the present invention that are sufficient to manufacture the semiconductor wafer processed in the process shown in FIGS. 1A–1O.

The prior art process steps shown in FIGS. 1A–1O will be discussed in conjunction with the process shown in FIGS. 2A–2O in accordance with the present invention in order to clearly point out which process steps have been modified or eliminated.

FIG. 1A shows a portion 100 of a partially completed prior art semiconductor wafer including a core transistor 102 region, an n-channel transistor 104 region and a p-channel transistor 106 region. A diffused region 108 is shown in the core transistor 102 region. A layer 114 of photoresist is formed on the wafer.

FIG. 2A shows a portion 200 of a partially completed prior art semiconductor wafer including a core transistor 202 region, an n-channel transistor 204 region and a p-channel transistor 206 region. A diffused region 208 is shown in the core transistor 202 region. A layer 214 of photoresist is formed on the wafer.

FIG. 1B shows the portion 100 of the partially completed semiconductor wafer as shown in FIG. 1A with the portion of the layer 114 of photoresist removed from over the p-channel region 106 and the portion 100 being implanted with a PLdd implant indicated by arrows 116. Gate structures 118 are shown formed on the core transistor 102 region, the n-channel 104 region and the p-channel transistor 106 region.

FIG. 2B shows the portion 200 of the partially completed semiconductor wafer as shown in FIG. 2A with the portion of the layer 214 of photoresist removed from over the p-channel region 206 and the portion 200 being implanted with a PLdd implant indicated by arrows 216. Gate structures 218 are shown formed on the core transistor 202 region, the n-channel 204 region and the p-channel transistor 206 region. The formation of gate structures is well known in the art and the methods of forming them will not be discussed.

FIG. 1C shows the portion 100 of the partially completed semiconductor wafer as shown in FIG. 1B with the remaining portions of the layer 114 of photoresist removed and showing the PLdd implant regions 120 in the p-channel region 106.

FIG. 2C shows the portion 200 of the partially completed semiconductor wafer as shown in FIG. 2B with the remaining portions of the layer 214 of photoresist removed and showing the PLdd implant regions 220 in the p-channel region 206.

FIG. 1D shows the portion 100 of the partially completed semiconductor wafer as shown in FIG. 1C with a layer 122 of photoresist formed on the wafer.

FIG. 2D shows the portion 200 of the partially completed semiconductor wafer as shown in FIG. 2D with a layer 222 of photoresist formed on the wafer.

FIG. 1E shows the portion 100 of the partially completed semiconductor wafer as shown in FIG. 1D with the portion of the layer 122 of photoresist removed from over the n-channel transistor 104 region and showing the wafer being implanted with an NLdd implant indicated by the arrows 124.

FIG. 2E shows the portion 200 of the partially completed semiconductor wafer as shown in FIG. 2D with the portion of the layer 222 of photoresist removed from over the n-channel transistor 204 region and showing the wafer being implanted with an NLdd implant indicated by the arrows 224.

FIG. 1F shows the portion 100 of the partially completed semiconductor wafer as shown in FIG. 1E with the remaining portion of the layer 122 of photoresist removed and a layer 126 of spacer oxide formed on the wafer. Also shown are the NLdd regions 128 formed in the n-channel transistor 104 region.

FIG. 2F shows the portion 200 of the partially completed semiconductor wafer as shown in FIG. 2E with the remaining portion of the layer 222 of photoresist removed. In accordance with the present invention, the step of depositing a layer of spacer oxide is skipped.

FIG. 1G shows the portion 100 of the partially completed semiconductor wafer as shown in FIG. 1F with the layer 126 of spacer oxide etched to form sidewall spacers 130 on the gate structures 118.

FIG. 2G indicates that the step of spacer etch is not necessary in accordance with the present invention.

FIG. 1H shows the portion 100 of the partially completed semiconductor wafer as shown in FIG. 1G with a layer 132 of photoresist formed on the wafer.

FIG. 2H shows the portion 200 of the partially completed semiconductor wafer as shown in FIG. 2F with a layer 232 of photoresist formed on the wafer.

FIG. 1I shows the portion 100 of the partially completed semiconductor wafer as shown in FIG. 1H with the portion of the layer 132 of photoresist removed from over the n-channel transistor region 104.

FIG. 2I shows the portion 200 of the partially completed semiconductor wafer as shown in FIG. 2H with resist spacers formed on the n-channel transistor gate. The portion 234 of the layer 232 of photoresist over the n-channel transistor region 204 has been patterned with a dimension $G_n+2S_n$ where $G_n$ is the width of the n-channel gate structure 218 and $S_n$ is the width of an n-channel resist spacer. The actual dimensions of $G_n$ and $S_n$ depend upon the process being used and the dimensions are easily determinable by a person of ordinary skill in the art. As should be appreciated the dimension $G_n+2S_n$ determines the length of the channel that will be formed under the n-channel gate 218.

FIG. 1J shows the portion 100 of the partially completed semiconductor wafer as shown in FIG. 1I undergoing an $N^+$ implant indicated by arrows 134.

FIG. 2J shows the portion 200 of the partially completed semiconductor wafer as shown in FIG. 2I undergoing an $N^+$ implant indicated by arrows 234.

FIG. 1K shows the portion 100 of the partially completed semiconductor wafer as shown in FIG. 1J with the remaining portion of the layer 132 of photoresist removed and showing the $N^+$ regions 136 formed in the n-channel transistor 104 region.

FIG. 2K shows the portion 200 of the partially completed semiconductor wafer as shown in FIG. 2J with the remaining portion of the layer 232 of photoresist including the patterned spacer resist 234 removed and showing the $N^+$ regions 236 formed in the n-channel transistor region 204.

FIG. 1L shows the portion 100 of the partially completed semiconductor wafer as shown in FIG. 1K with a layer 138 of photoresist formed on the wafer.

FIG. 2L shows the portion 200 of the partially completed semiconductor wafer as shown in FIG. 2K with a layer 238 of photoresist formed on the wafer.

FIG. 1M shows the portion 100 of the partially completed semiconductor wafer as shown in FIG. 1L with the portion of the layer 138 of photoresist removed from over the p-channel transistor region 106.

FIG. 2M shows the portion 200 of the partially completed semiconductor wafer as shown in FIG. 2L with resist spacers formed on the p-channel gate structure. The portion 240 of the layer 238 of photoresist over the p-channel region 206 has been patterned with a dimension $G_p+2S_p$ where $G_p$ is the width of the p-channel gate structure 218 and $S_p$ is the width of a p-channel resist spacer. The actual dimensions of $G_p$ and $S_p$ depend upon the process being used and the dimensions are easily determinable by a person of ordinary skill in the art. As should be appreciated, the dimension $G_n+2S_n$ determines the length of the channel that will be formed under the p-channel gate 218.

FIG. 1N shows the portion 100 of the partially completed semiconductor wafer as shown in FIG. 1M being implanted with a $P^+$ implant indicated by arrows 142.

FIG. 2N shows the portion 200 of the partially completed semiconductor wafer as shown in FIG. 2M being implanted with a P+ implant indicated by arrows 242.

FIG. 1O shows the portion 100 of the partially completed semiconductor wafer as shown in FIG. 1N with the remaining portion of the layer 138 of photoresist removed and with P+ regions 144 formed in the p-channel transistor region 106.

FIG. 2O shows the portion 200 of the partially completed semiconductor wafer as shown in FIG. 2N with the remaining portion of the layer 238 of photoresist removed and with P+ regions 244 formed in the p-channel transistor region 206.

Figure 3:
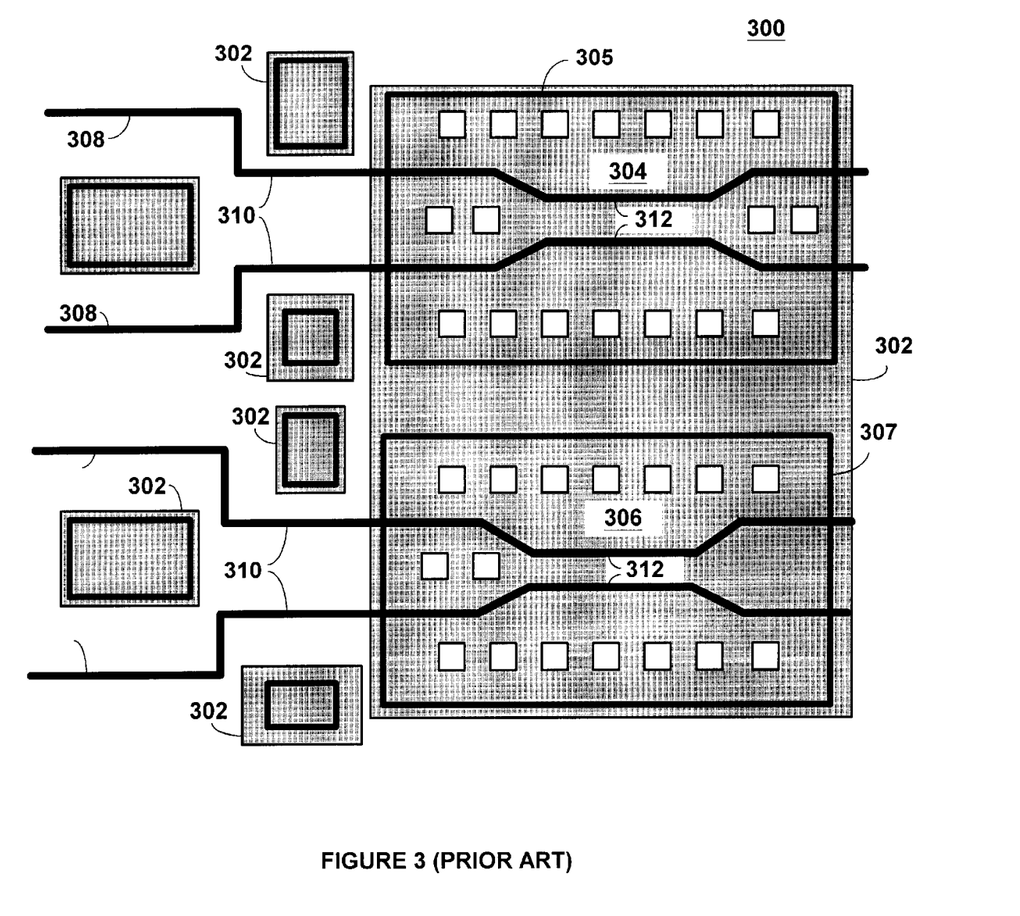
FIG. 3 shows a prior art transistor layout for $N^+$ and $P^+$ implants.

FIG. 3 shows a portion 300 of a transistor layout in accordance with prior art implant areas, indicated by the shaded areas 302, that cover the active area 304 delineated by line 305 and active area 306 delineated by line 307 and other diffusion areas that are to be implanted with N+ and/or P+ implants. The other diffusion areas are structures well known in the art, such as guard ring structures and will not be discussed. The lines 308 are polysilicon (Poly II) structures with portions 310 acting as interconnects and portions 312 acting as gates for transistors constructed in the active areas 304 and 306.

Figure 4:
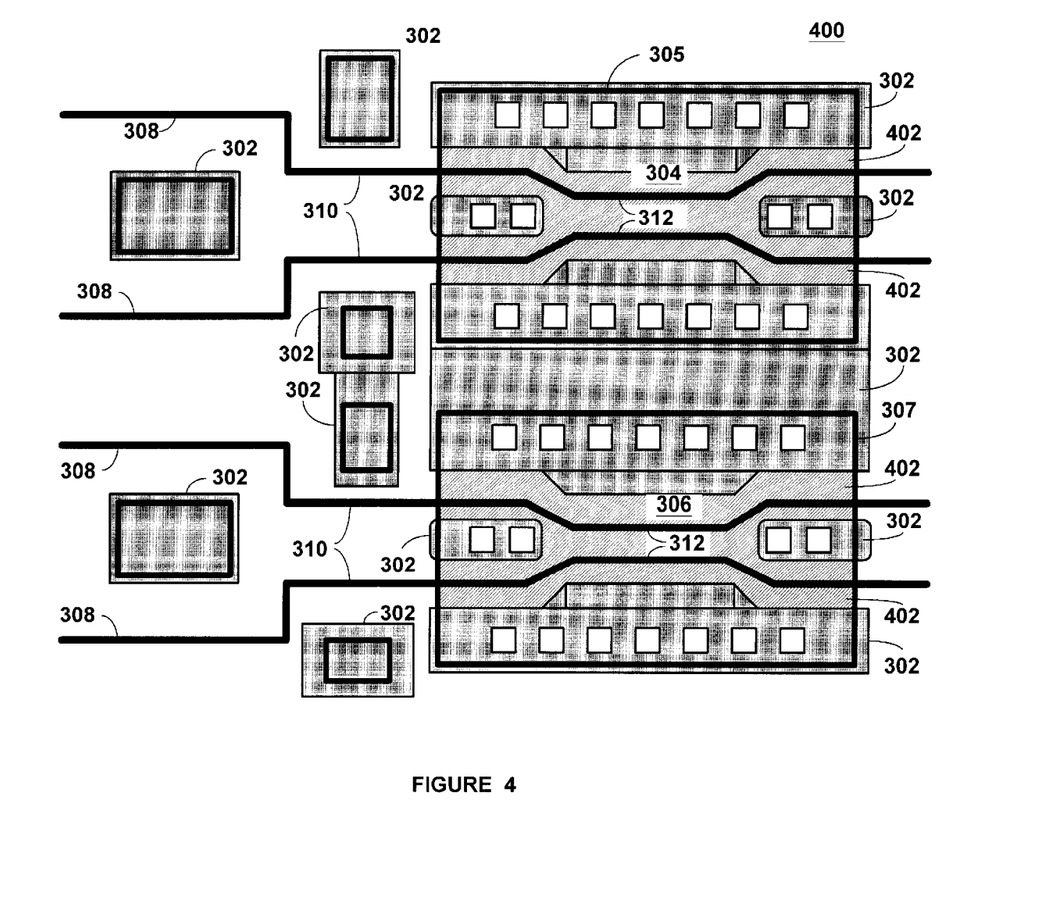
FIG. 4 shows the transistor layer with a resist spacer for $N^+$ and $P^+$ implants in accordance with the present invention.

FIG. 4 shows the portion 300 of the transistor layout as shown in FIG. 3 with implant areas in accordance with the present invention and where like numerals represent like elements. Crosshatched areas 402 show the layout of the resist spacers (see FIGS. 2I & 2M) for subsequent N+ or P+ implants (see FIGS. 2J & 2N). The N+ and P+ implants are implanted into areas within the lines 305 and 307 that are not protected by the resist spacer 402. Note that portions 312 of the lines 308 that act as gates for transistors constructed in the active areas 304 and 306 are too close to allow resolution of individual spacers (that is to allow a space between the individual spacers) so the individual spacers are merged.

In summary, the present invention overcomes the limitations of the prior art and provides a method for the manufacture of semiconductor flash memory devices that reduces the number of manufacturing steps necessary to manufacture the flash memory devices and results in a reduction of the cost of producing the flash memory devices.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing flash technology semiconductor devices that eliminates a standard oxide spacer process during the manufacturing process, the method comprising:

(a) forming gate structures on a semiconductor substrate in regions in which core transistors, n-channel and p-channel transistors will be formed;

(b) forming PLdd implant regions in regions in which p-channel transistors will be formed;

(c) forming Nldd implant regions in regions in which n-channel transistors will be formed;

(d) without forming silicon oxide sidewall spacers on any of the gate structures, forming a first layer of photoresist on exposed surfaces of the gate structures and the semiconductor substrate;

(e) patterning and developing the first layer of photoresist exposing portions of the n-channel regions in the semiconductor substrate;

(f) implanting the exposed portions of the n-channel regions with an N+ implant;

(g) removing the first layer of photoresist;

(h) forming a second layer of photoresist on exposed surfaces of the gate structures and the semiconductor substrate;

(i) patterning and developing the second layer of photoresist exposing portions of the p-channel regions in the semiconductor substrate; and (j) implanting the exposed portions of the p-channel regions with a P+ implant.

2. The method of claim 1 wherein step (e) is accomplished by patterning and developing a portion of the first layer of photoresist over n-channel gate structures wherein the portion of the first layer of photoresist has a dimension of $G_n + 2S_n$ wherein $G_n$ is a dimension of the gate structure formed on the region in which an n-channel transistor will be formed and $S_n$ is a dimension added to each end of the dimension $G_n$ wherein $S_n$ is dependent upon a process being used to form the semiconductor device.

3. The method of claim 1 wherein step (i) is accomplished by patterning and developing a portion of the second layer of photoresist over p-channel gate structures wherein the portion of the second layer of photoresist has a dimension of $G_p + 2S_p$ wherein $G_p$ is a dimension of the gate structure formed on the region in which a p-channel transistor will be formed and $S_p$ is a dimension added to each end of the dimension $G_p$ wherein $S_p$ is dependent upon a process being used to form the semiconductor device.

* * * * *